United States Patent [19]
Asakura et al.

[11] Patent Number: 5,448,398
[45] Date of Patent: Sep. 5, 1995

[54] DIFFRACTION GRATING UNIT AND SECOND-HARMONIC GENERATOR EMPLOYING THE SAME

[75] Inventors: Hiroyuki Asakura, Osaka; Masanori Iida, Neyagawa, both of Japan

[73] Assignee: Matsushita Electric Industrial Co., Ltd., Osaka, Japan

[21] Appl. No.: 121,346

[22] Filed: Sep. 15, 1993

[30] Foreign Application Priority Data

Sep. 22, 1992 [JP] Japan .................. 4-252587

[51] Int. Cl.⁶ ............ G02B 5/18; G02B 5/28; G02F 1/35; H01S 3/10
[52] U.S. Cl. ................ 359/328; 359/576; 359/590
[58] Field of Search ............ 359/328, 566, 569, 572, 359/576, 590

[56] References Cited

U.S. PATENT DOCUMENTS

| | | | |
|---|---|---|---|
| 4,114,978 | 9/1978 | Bostick et al. | 359/572 |
| 4,436,398 | 3/1984 | Endo et al. | 359/572 |
| 4,484,072 | 11/1984 | Matsumura | 359/572 |
| 4,531,809 | 7/1985 | Carter et al. | 359/572 |
| 4,591,256 | 5/1986 | Matsumura | 359/572 |
| 5,117,126 | 5/1992 | Geiger | 359/328 |
| 5,119,231 | 6/1992 | Nelson et al. | 359/359 |
| 5,210,404 | 5/1993 | Cush et al. | 359/572 |
| 5,233,620 | 8/1993 | Shinozaki et al. | 359/328 |
| 5,301,059 | 4/1994 | Kitaoka et al. | 359/328 |
| 5,303,247 | 4/1994 | Yamamoto et al. | 359/328 |
| 5,317,666 | 5/1994 | Agostinelli et al. | 359/328 |

FOREIGN PATENT DOCUMENTS

0473441 3/1992 European Pat. Off. .

*Primary Examiner*—Martin Lerner
*Attorney, Agent, or Firm*—Wenderoth, Lind & Ponack

[57] ABSTRACT

A diffraction grating unit includes a reflection type diffraction grating; a transparent medium; and a filter which is formed on the diffraction grating through the transparent medium so as to be disposed on an incident surface of the diffraction grating unit; wherein the filter transmits therethrough a ray having a specific wavelength but reflects a further ray having a wavelength equal to a half of the specific wavelength of the ray, and a second-harmonic generator employing the diffraction grating unit.

10 Claims, 11 Drawing Sheets

DIFFRACTION GRATING UNIT AND SECOND-HARMONIC GENERATOR EMPLOYING THE SAME

BACKGROUND OF THE INVENTION

The present invention relates to a diffraction grating unit and a second-harmonic generator employing the diffraction grating unit.

A second-harmonic generator which converts light of a fundamental wave to light having a wavelength half of that of the fundamental wave by using a non-linear element has been proposed as a short-wavelength light source. The conversion efficiency of a prior art quasi-phase matching type of second-harmonic generator having a domain reversal structure is especially high and the optical characteristics of the output light are also excellent. In this prior art second-harmonic generator as disclosed in, for example, European Patent Publication No. 0473441 A2, a light return type of resonator employs a diffraction grating to stably oscillates a laser diode which emits a fundamental wave.

Figure 9:
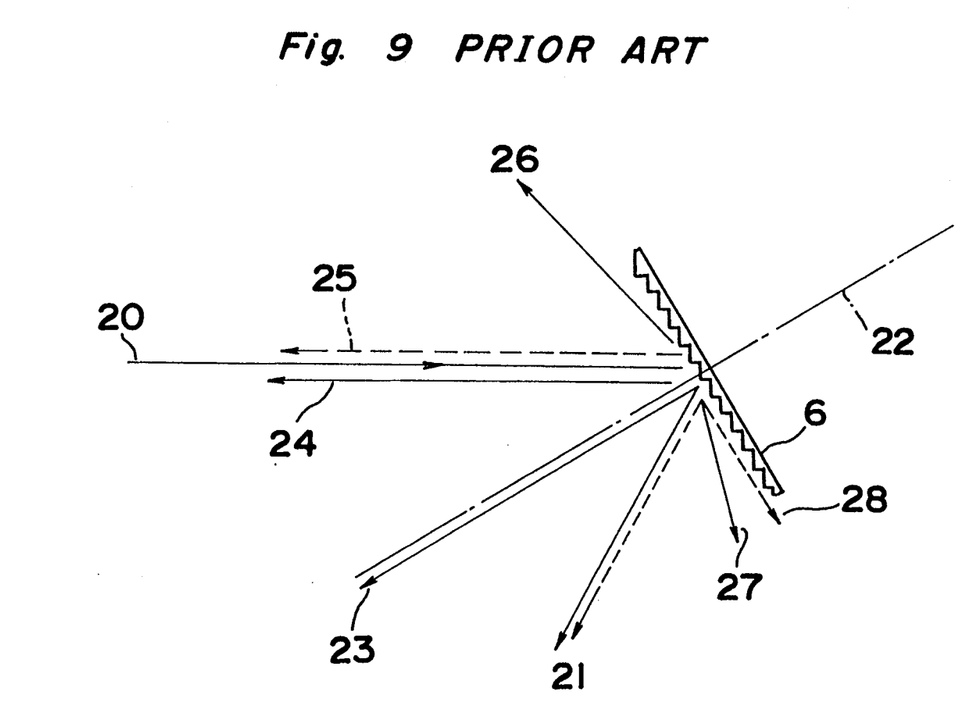
FIG. 9 is a view illustrating the relation between wavelength and diffracted rays in a prior art diffraction grating.

In the prior art second-harmonic generator, since light including a second-harmonic is picked up by the diffraction grating, light of the zero-th order and higher is diffracted by the diffraction grating and the second-harmonic is dispersed in various directions. FIG. 9 shows schematically how diffracted rays are generated when input light 20 of a fundamental wave and a generated second-harmonic (SHG) has been incident upon a diffraction grating 6 having a normal 22. The diffracted light includes a zero-order 21 of the fundamental wave and a zero-order of the generated second harmonic (SHG), a first-order 23 of the SHG, a second-order of the SHG, a first-order 25 of the fundamental wave, a third-order 26 of the SHG, a minus first-order 27 of the SHG and a minus first-order 28 of the fundamental wave.

The SHG has a wavelength equal to half that of the fundamental wave and is, therefore, diffracted in more directions than the fundamental wave. Thus, it is impossible to effectively pick up the light output and accordingly, the quantity of light for actual use is fairly small. Since the diffracted light which is not returned to the SHG element is also generated from the fundamental wave, the quantity of light returned to the SHG element is relatively small. As a result, the optical output of the laser diode is correspondingly small, thereby detracting from the conversion efficiency of the SHG element. When the quantity of light returned to the SHG element is small, the oscillation of the laser diode becomes unstable, so that the wavelength of the laser light varies according to changes in ambient conditions such as temperature, vibrations, etc. and thus, a stable phase matching state cannot be maintained.

Meanwhile, in the conventional optical resonator, since a Littrow type of optical system is employed for returning a first-order of a fundamental wave to the laser diode, a second-order of the SHG is oriented in a direction identical with that of the first-order of the fundamental wave. Therefore, the SHG propagates along an optical path identical with that of the fundamental wave so as to return to the SHG element, thus resulting in noise and producing instability in the output due to undesirable resonation.

Furthermore, the known methods have a drawback in that the intensity of the SHG is not variable.

Meanwhile, in the prior art, a prism has been employed as a resonator in which the fundamental wave and the second-harmonic are separated. However, the prism has poor resolution. Thus, the wavelength conversion efficiency is poor when considered over a wide range of oscillation wavelengths.

SUMMARY OF THE INVENTION

Accordingly, an essential object of the present invention is to provide a second-harmonic generator in which the intensity of the output is variable and yet is accompanied by low noise.

In order to accomplish this object of the present invention, a diffraction grating and a filter are provided integrally with each other in a diffraction grating unit, and light is returned to the laser of the second-harmonic generator by the diffraction grating unit such that the unit serves as a resonator.

In addition, a narrow-band wavelength selecting element may be employed by the resonator.

Furthermore, the second-harmonic generator may include an SHG element provided with a mode converting portion.

With the above-described features, the second-harmonic generator of the present invention has low noise and a high output with high efficiency.

BRIEF DESCRIPTION OF THE DRAWINGS

This object and other features of the present invention will become apparent from the following description of preferred embodiments thereof made with reference to the accompanying drawings, in which.

Before the description of the present invention proceeds, it is to be noted that like parts are designated by

DETAILED DESCRIPTION OF THE PREFERRED EMBODIMENTS

Figure 1:
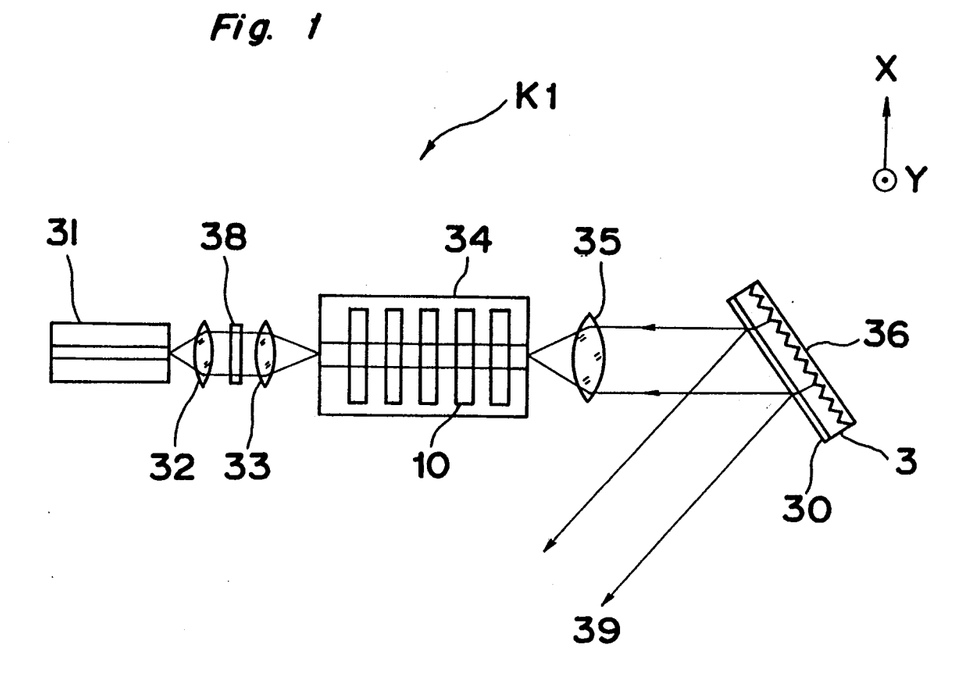
FIG. 1 is a schematic view of a first embodiment of a second-harmonic generator according to the present invention.
Figure 2:
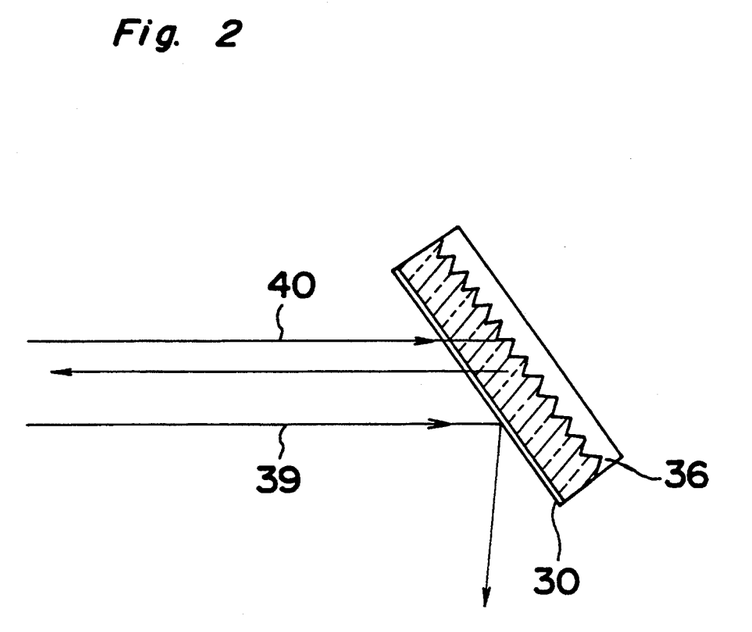
FIG. 2 is a schematic view of one type of diffraction grating unit used in the second-harmonic generator of FIG. 1.

Referring now to the drawings, FIG. 1 shows a first embodiment of a second-harmonic generator K1 according to the present invention, which has a reversely distributed waveguide structure based on a quasi-phase matching method. In the second-harmonic generator K1, a diffraction grating unit includes a diffraction grating 36 and a filter 30. In order to prevent stray light from entering the diffraction grating unit, end faces 3 of the diffraction grating unit are subjected to a processing by which the end faces will absorb or transmit light. More specifically, the end faces 3 are coated with black paint, a light absorbing film or an anti-reflection coating. Meanwhile, the plane of the polarization of light outputted from a laser diode 31 is rotated 90° by a half-wavelength plate 38 and the light is coupled with an SHG element 34 with high efficiency by a lens 33. The light which has passed through the SHG element 34 is transmitted to the diffraction grating 36 via a lens 35. As shown in FIG. 2, the filter 30 reflects an SHG 39 but transmits therethrough light having a wavelength longer than that of the SHG, for example, light of a fundamental wave 40. The light which has been transmitted through the filter 30 is incident upon the diffraction grating 36. Only light of a wavelength of the fundamental wave is diffracted by the diffraction grating 36 along the input direction so as to return to the laser diode 31 along the original optical path. The laser diode 31 is oscillated at this wavelength of the fundamental wave. Because the fundamental wave of the light emitted by the laser diode 31 is phase-matched with the SHG element, the light is converted into an SHG having a wavelength equal to half that of the fundamental wave.

The SHG 39 outputted from the SHG element 34 is as a whole reflected in one direction by the filter 30 as shown in FIG. 1. Meanwhile, the fundamental wave 40 which has not been converted into the SHG in the SHG element 34 is transmitted through the filter 30 and is incident upon the diffraction grating 36 so as to be returned along the original input optical path.

In the present invention, if the SHG element 34 is made of material having non-linear characteristics, for example, $LiNbO_3$, $LiTaO_3$, $KTiOP_3$, etc., a high output can be obtained. In the diffraction grating 36 of the present invention, assuming that n denotes a refractive index of its transparent medium and $\lambda$ denotes a wavelength of the fundamental wave, the fundamental wave 40 is diffracted in the direction of first-order diffraction at a high efficiency of 90% or more when the period d of the diffraction grating 36 falls within the following range.

$$1.5 \times \lambda/n > d > 0.5 \times \lambda/n \quad (1)$$

Figure 10:
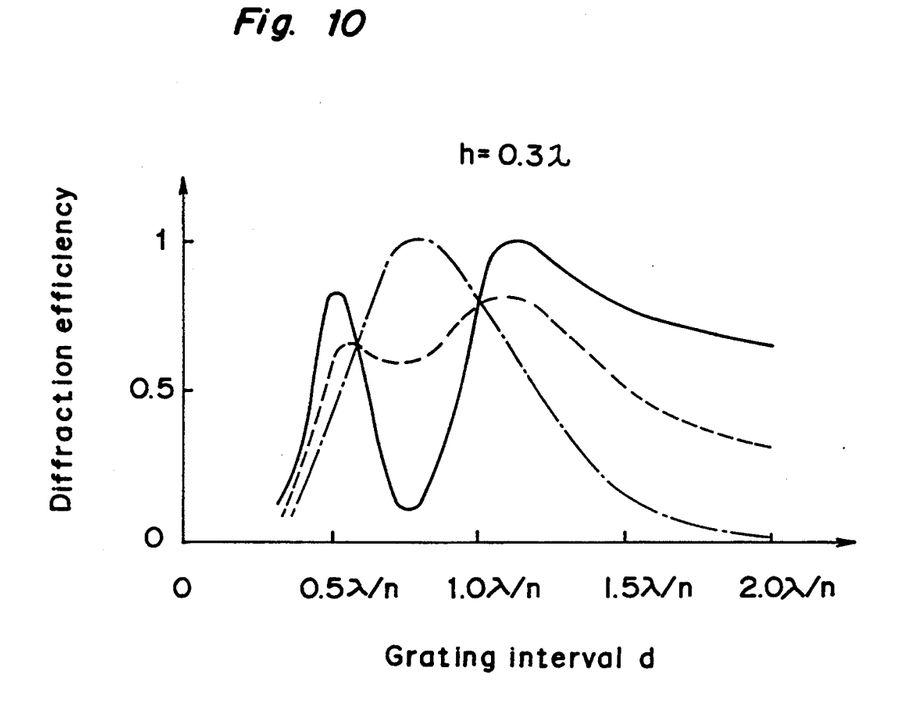
FIG. 10 is a graph showing the relation between the pitch of grooves and the diffraction efficiency of a diffraction grating of the second-harmonic generator of FIG. 1.

This is because under this condition, diffracted light of a higher order is not produced and diffraction is limited to zero-th order and first order, thereby resulting in high electromagnetic interaction. FIG. 10 shows the relation between the period d and first-order diffraction efficiency of the diffraction grating 36. In FIG. 10, the solid line represents a case in which polarized light of the input light is perpendicular to grooves of the grating, the one-dot chain line represents a case in which polarized light of the input light is parallel to the grooves of the grating and the broken line represents the mean of the solid line and the one-dot chain line. When the period d of the grating is less than $(1.5 \times \lambda/n)$, diffracted light of the second and higher orders is not generated. Meanwhile, when the period d of the grating is less than $(0.5 \times \lambda/n)$, the mean value of the first order diffraction efficiency is reduced to less than half of its peak. Since the diffraction grating satisfying the above condition has high diffraction efficiency relative to the input light, optical loss of the laser resonator is small and thus, high output can be obtained.

Therefore, since the laser diode 31 oscillates stably at the wavelength of the fundamental wave due to the large amount of light returned thereto by the diffraction grating 36, a high output of the SHG 39 is obtained efficiently and stably. Moreover, the grooves of the grating are oriented in the direction perpendicular to the sheet of FIG. 1, i.e., along the Y-axis. However, if the waveguide of the SHG element is rectangular and extends longitudinally of the direction of the X-axis, and the grooves are oriented parallel to the sheet of FIG. 1, the returning light will have a higher resolution.

Figure 3A:
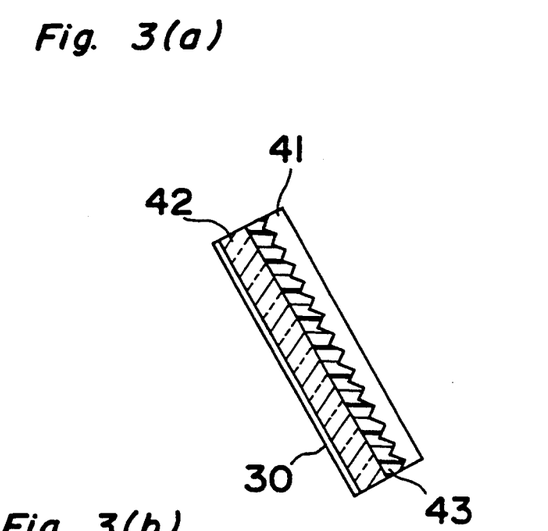
FIG. 3(a) and 3(b) are schematic views of other types of the diffraction grating unit, respectively.
Figure 3B:
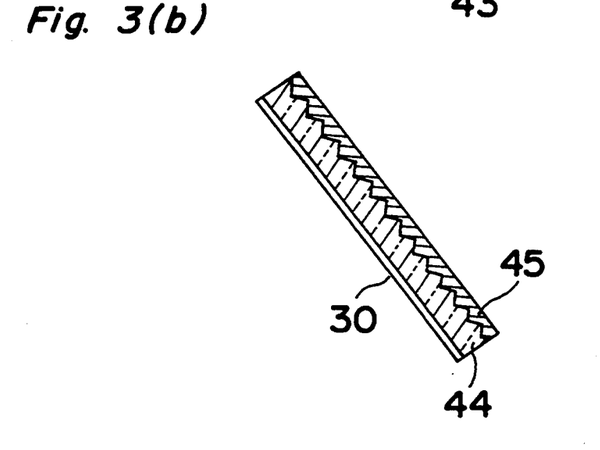

FIGS. 3(a) and 3(b) show other examples of the diffraction grating unit of the second-harmonic generator K1. In the diffraction grating unit of FIG. 3(a), a glass substrate 42 on which the filter 30 is provided is bonded to the grooved surface of a reflection type of diffraction grating 41 by adhesive 43 made of transparent resin having a refractive index equal to that of the glass substrate 42. If photosetting resin is used for the adhesive 43, the diffraction grating 41 can be produced efficiently. The substrate 42 may be made of any transparent material such as resin and crystalline materials. In the diffraction grating unit of FIG. 3(b), a diffraction grating substrate 44 is obtained by forming grooves in a transparent material. A reflective surface of a metallic material 45 is coated or plated on the grooved surface of substrate 44. The filter 30 is formed on the other surface of the substrate 44. If etching, molding using dies or a sol-gel method is employed for forming the grooved substrate 44, a large quantity of the substrate 44 can be produced at low cost. Also in the diffraction grating unit of FIG. 3(b), the substrate 44 may be made of resin, glass, a crystalline material or the like. If the substrate 44 is made of resin, the substrate 44 can be produced easily. Meanwhile, if the substrate 44 is made of glass or a crystalline material, thermal expansion of the substrate 44 is small, whereby the substrate 44 is highly reliable.

Figure 4:
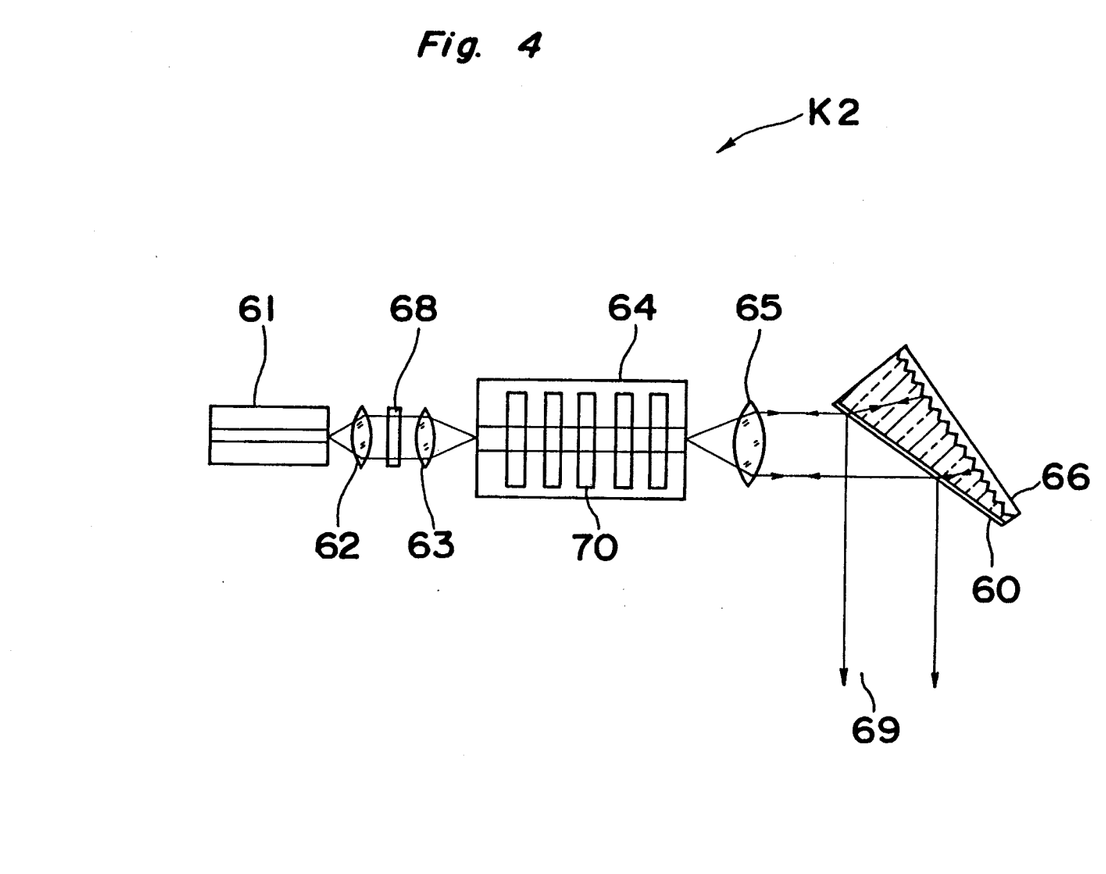
FIG. 4 is a schematic view of a second embodiment of a second-harmonic generator according to the present invention.

FIG. 4 shows a second embodiment of a second-harmonic generator K2 according to the present invention. In a diffraction grating unit of the second-harmonic generator K2, the grooved surface of a diffraction grating 66 and a reflective surface of a filter 60 are inclined with respect to each other. Therefore, an SHG 69 can be reflected in a direction forming a desired angle with an axis of an optical resonator. In this embodiment, a prism is employed as a substrate between the diffraction grating 66 and the filter 60.

Figure 5:
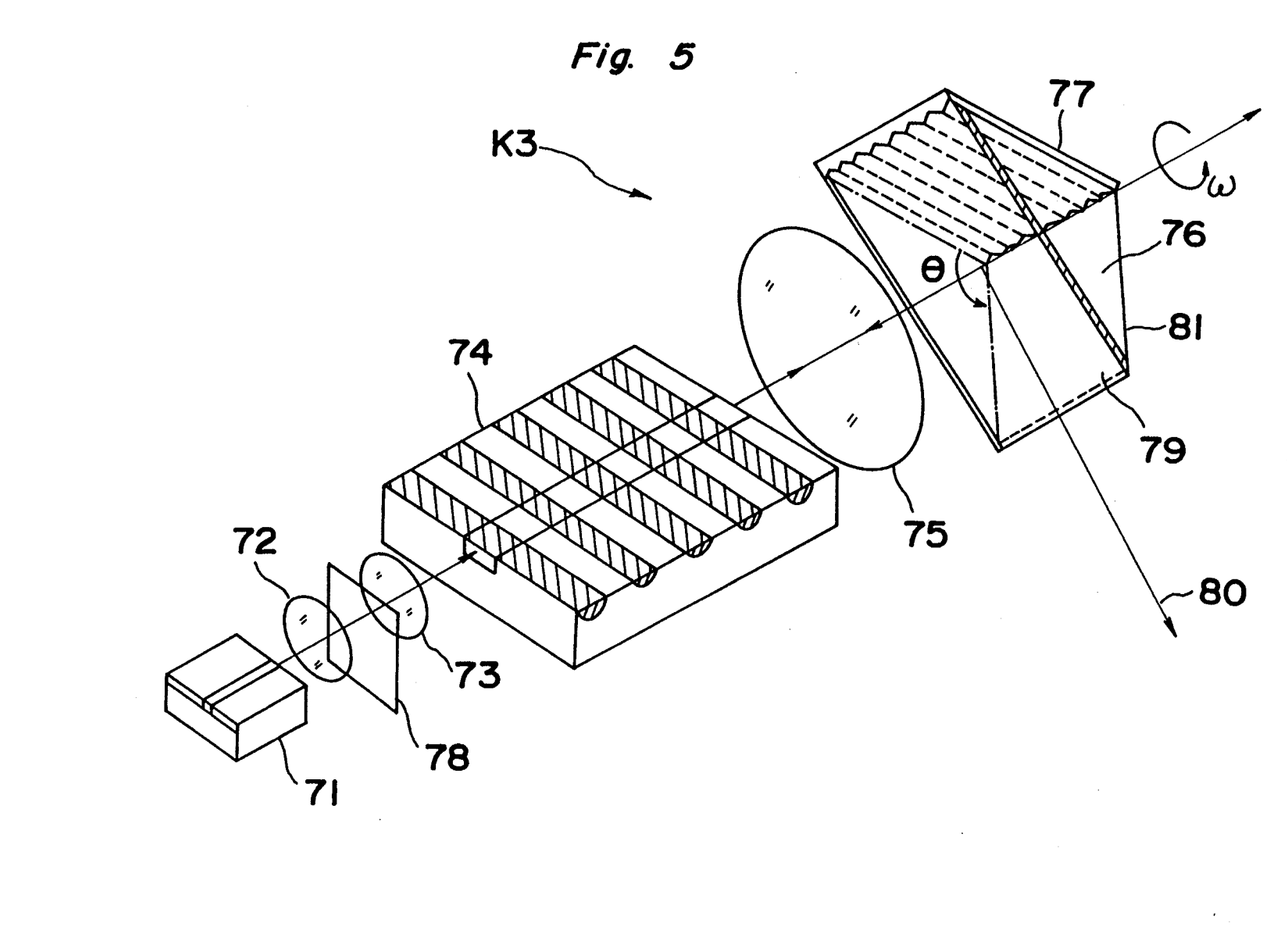
FIG. 5 is a schematic view of a third embodiment of a second-harmonic generator according to the present invention.

A third embodiment of a diffraction grating unit and a second-harmonic generator K3 employing a diffraction grating unit, according to the present invention, are described hereinbelow with reference to FIG. 5. In this embodiment, the diffraction grating unit for a resonator is constituted by a diffraction grating 77, a rectangular prism 76 and a filter 79. Grooves of the diffraction grating 77 extend in a direction perpendicular to an edge of the rectangular prism 76 at which two orthogonal surfaces of the prism 76 intersect. In FIG. 5, the filter 79 is disposed at a front surface of the rectangular prism 76 so as to confront a lens 75, while the diffraction grating 77 is disposed at a rear surface of the rectangular prism 76. Basic functions of the second-harmonic generator K3 are similar to those of the second-harmonic generator K1. The diffraction grating 77 and the rectangular prism 76 are used for returning a fundamental wave along the original optical path. Output light is reflected along input direction irrespective of the relative rotational position ω of the rectangular prism 76 with respect to edge thereof, thus resulting in stable light return. An SHG 80 is reflected to the outside of the resonator by the filter 79 without loss. As in the first embodiment, the diffraction grating 77 may be bonded to the rectangular prism 76 or grooves of the grating 77 may be formed directly on a reflective surface of the rectangular prism 76.

Meanwhile, in the second-harmonic generator K3 of the present invention, the plane of polarization of light outputted from a laser diode 71 is rotated through 90° by a half-wavelength plate 78 and the light is coupled with an SHG element 74 at high efficiency. The light which has passed through the SHG element 74 is incident upon the rectangular prism 76 and the diffraction grating 77 via the lens 75. The filter 79 reflects the SHG but transmits therethrough light having a wavelength longer than that of the SHG. A portion of the light which has been transmitted through the filter 79 is incident upon the diffraction grating 77, while the remainder of the light is incident upon a reflective surface 81 of the diffraction grating 77. Only light of a wavelength of the fundamental wave is diffracted by the diffraction grating 77 in the input direction so as to return to the laser diode 71. Meanwhile, the light incident on the reflective surface 81 is totally reflected so as to be incident upon the diffraction grating 77. Thus, that portion of the light incident on the reflective surface 81 and having the wavelength of the fundamental wave is diffracted in the input direction so as to also return to the laser diode 71. The laser diode 71 is oscillated at this wavelength of the fundamental wave as phase-matched with the SHG element 74.

The fundamental wave outputted from the laser diode 71 undergoes phase matching at the SHG element 74 so as to be converted into an SHG 80 having a wavelength equal to half that of the fundamental wave. The SHG 80 emitted from the SHG element 74 is reflected outside the resonator by the filter 79. The fundamental wave which has not been converted into the SHG in the SHG element 74 is transmitted through the filter 79 and is incident upon the diffraction grating 77 so as to be returned along the orthogonal input optical path.

Since the light of the resonator is reflected in the input direction without fail by the rectangular prism 76, the second-harmonic generator K3 is stable against disturbances such as angular deviation of the resonator, vibrations, etc.

In the diffraction grating of the present invention, assuming that n denotes a refractive index of the rectangular prism 76, λ denotes a wavelength of the fundamental wave and θ denotes the vertex angle of the rectangular prism 76, the fundamental wave is diffracted in the direction of first-order diffraction at a high efficiency of not less than 90% when the period d of the grooves of the diffraction grating falls within the following range.

$$1.5 \times \lambda/n > d \times \cos(\theta/2) > 0.5 \times \lambda/n \quad (2)$$

The reason for this is the same as that explained in connection with the first embodiment. In the equation (2), the diffraction constant d of the equation (1) is replaced by $\{d \times \cos(\theta/2)\}$. Under this condition, diffracted light of a higher order is not produced and diffraction is limited to zero-th order and first order, thus resulting in high electromagnetic interaction. Because the laser diode 71 oscillates stably at the wavelength of the fundamental wave due to a large amount of light returned thereto from the rectangular prism 76, a high output of the SHG 80 can be obtained efficiently and stably. From the description above, namely reference to prism 76 as a rectangular prism, it is clear that the angle θ is 90°.

Figure 6:
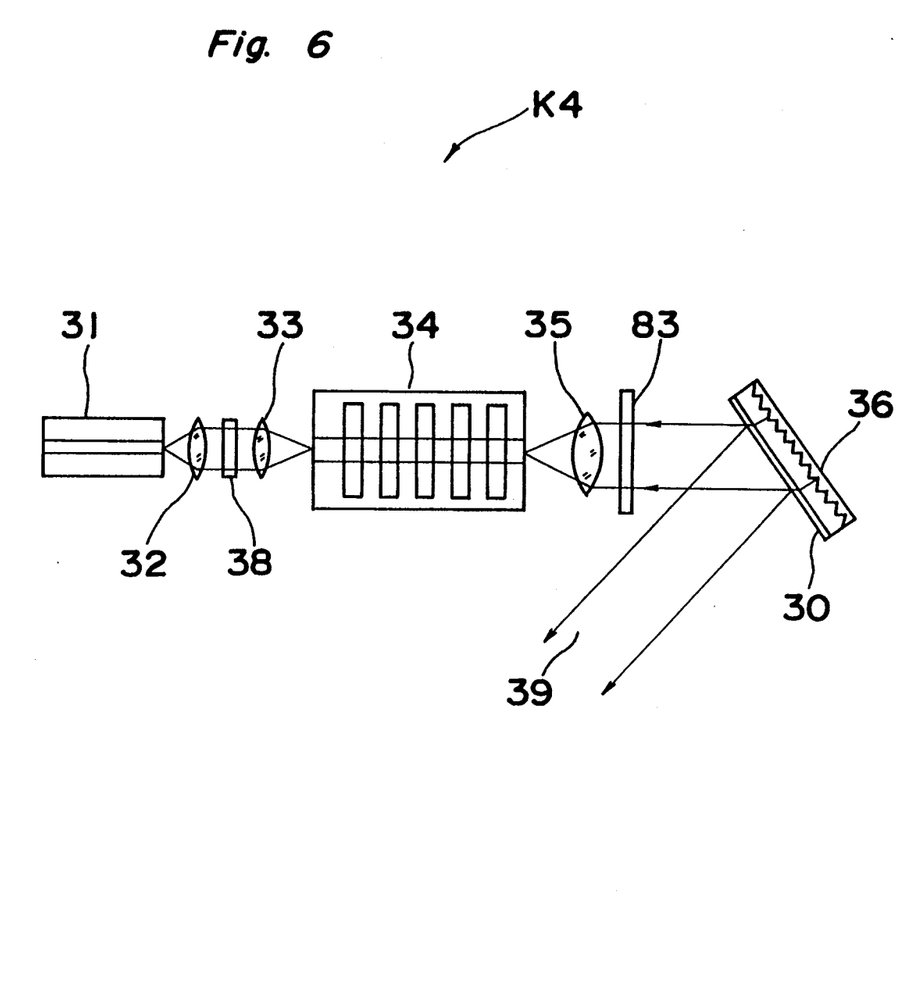
FIG. 6 is a schematic view of a fourth embodiment of a second-harmonic generator according to the present invention.

FIG. 6 shows a fourth embodiment of a second-harmonic generator K4 according to the present invention. In this embodiment, a narrow-band filter 83 is provided in a resonator of the second-harmonic generator K4. When the laser diode 31 is oscillated by the external resonator constituted by the diffraction grating 36 only, the laser diode 31 cannot be oscillated at a single lateral mode. By inserting the narrow-band filter 83 into the resonator, the laser diode 31 can be oscillated at a single lateral mode. The narrow-band filter 83 functions as an etalon which transits therethrough an SHG and selectively transmits therethrough a fundamental wave in accordance with its wavelength. An etalon utilizes an interference effect based on multiple reflection. Accordingly, since the laser diode 31 can be oscillated stably at a single wavelength, the noise of the laser is reduced and the conversion efficiency at the SHG element 34 is improved, so that high output can be obtained.

Figure 7:
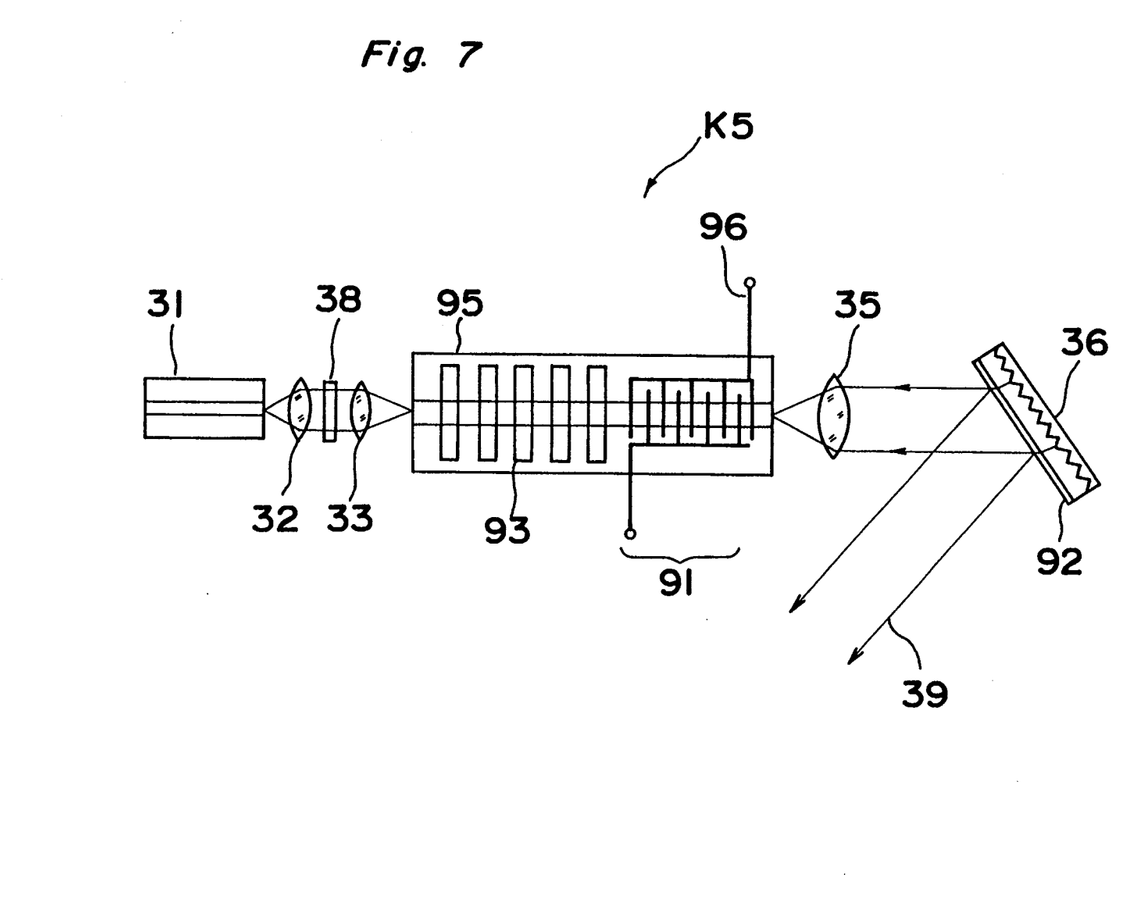
FIG. 7 is a schematic view of a fifth embodiment of a second-harmonic generator according to the present invention.

FIG. 7 shows a second-harmonic generator K5 according to a fifth embodiment of the present invention. In this embodiment, the SHG element 95 comprises an optical waveguide having a substrate of a non-linear material. The waveguide includes a phase reversal region 93 and a mode conversion portion 91. The mode conversion portion 91 is obtained by forming an electrode 96 on the substrate and is capable of changing the mode of propagation of light in the optical waveguide when a voltage is impressed on the electrode 96. The modes of propagation include the TE mode and the TM mode. The direction of polarization of light of the TE mode is perpendicular to that of the light of the TM mode. Therefore, changing the mode of propagation changes the direction of polarization of the light.

Furthermore, a polarization-dependent filter 92 transmits therethrough an SHG but reflects a fundamental wave only when the fundamental wave has a specific direction of polarization. Thus, when light which has passed through the phase reversal region 93 propagates into the mode converting portion 91, the direction of polarization of the SHG can be changed electrically through mode conversion to modulate the intensity of the SHG ray 39. Therefore, the second-harmonic generator K5 can be used for an optical recorder and a measuring device which requires modulation of optical signals. Still further, the optical system of the second-harmonic generator K3 of FIG. 5 may also be used in the second-harmonic generator K5.

Figure 8:
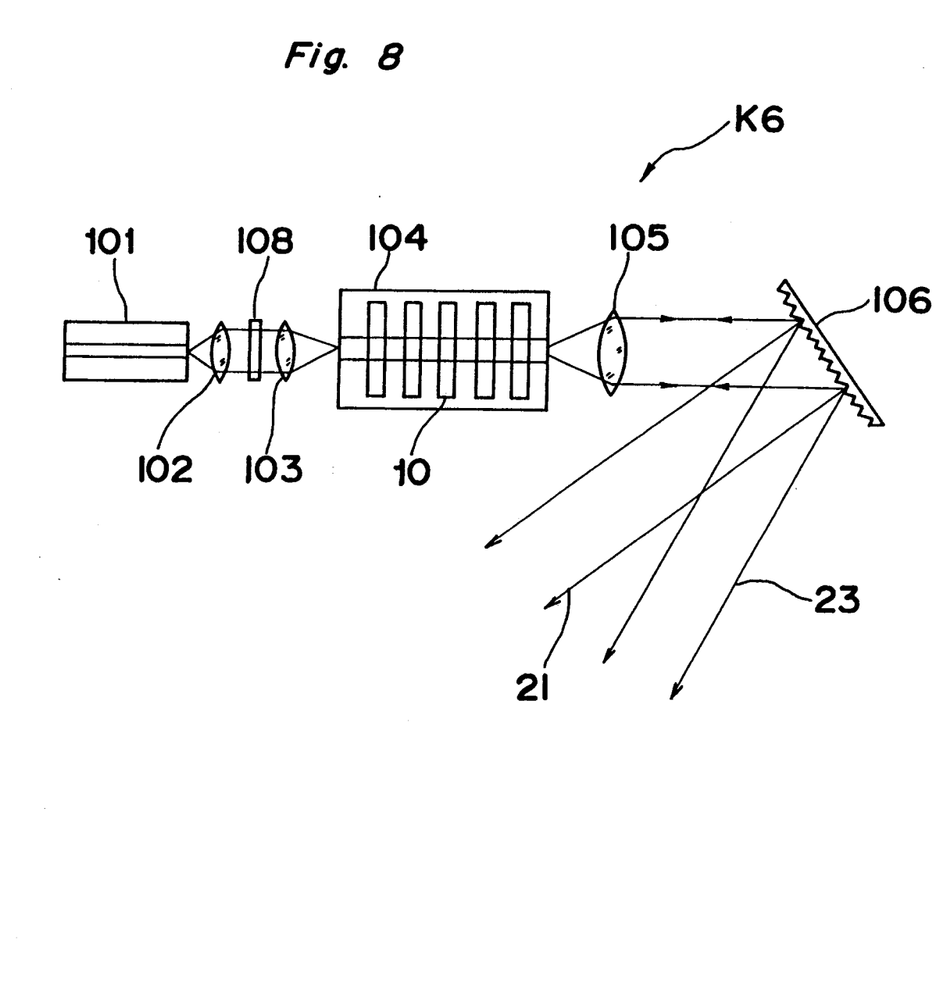
FIG. 8 is a schematic view of a sixth embodiment of a second-harmonic generator according to the present invention.

A sixth embodiment of a second-harmonic generator K6 according to the present invention will now be described with reference to FIG. 8. The second-harmonic generator K6 includes a Fourier diffraction grating 106. Assuming that λ denotes a wavelength of a fundamental wave, d denotes the period (pitch grooves) of the grating 106 and h denotes a depth of the grooves, the Fourier diffraction grating 106 satisfies the following conditions (3) and (4).

$$0.5 \times \lambda/n < d < 1.5 \times \lambda/n \quad (3)$$

$$0.2 \times d < h < 0.5 \times d \quad (4)$$

Since n denotes the refractive index of air, namely, n=1 in the equation (3), the equation (3) may be simplified into the following equation (3').

$$0.5 \times \lambda < d < 1.5 \times \lambda \quad (3')$$

The Fourier diffraction grating 106 is a grating whose sectional profile corresponds to a sine wave superposed with a finite number of its higher harmonics.

Figure 11:
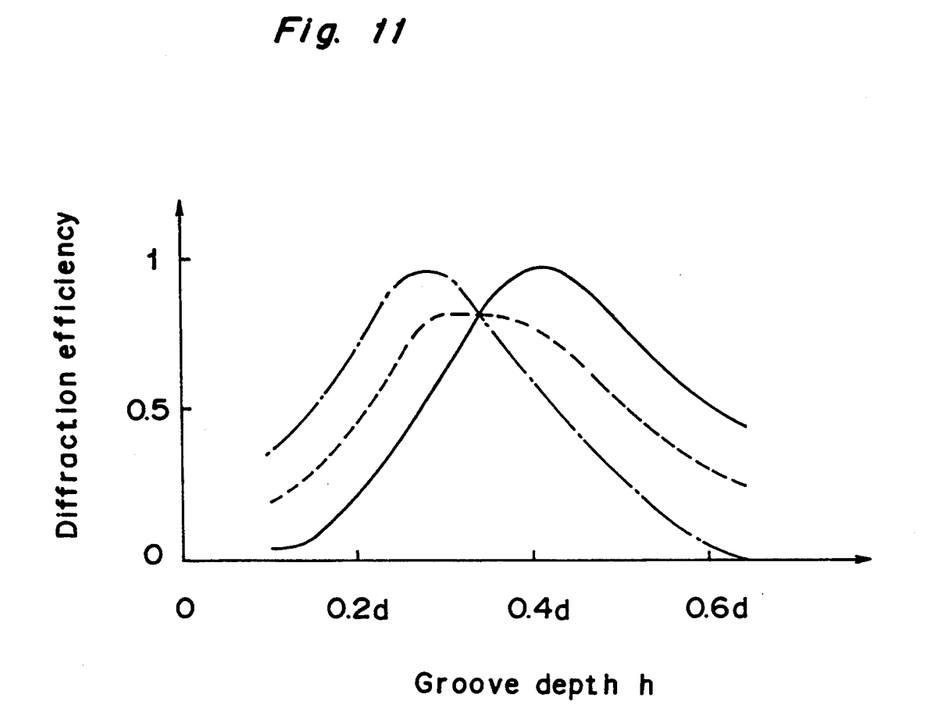
FIG. 11 is a graph showing the relation between the depth of grooves and the diffraction efficiency in a Fourier diffraction grating of the second-harmonic generator of FIG. 8.

FIG. 11 shows the relation between the depth of the grooves and diffraction efficiency in the Fourier diffraction grating 106. In FIG. 11, the solid line represents a case in which polarized light of the input light is perpendicular to the grooves of the grating, the one-dot chain line represents a case in which polarized light of the input light is parallel to the grooves of the grating and the broken line represents the mean of the solid line and the one-dot chain line. When the depth h of the grooves of the grating is larger than (0.5×d), the mean of the diffraction efficiency drops to less than half of its peak. Meanwhile, when the depth h of the grooves of the grating is smaller than (0.2×d), the mean of the diffraction efficiency also drops to the half of the peak. Since the Fourier diffraction grating 106 satisfying the above conditions is less dependent on polarized light for the input light, i.e. has a high diffraction efficiency, it contributes excellent optical characteristics to the second-harmonic generator such as suppressing optical loss and noise.

In the Fourier diffraction grating 106 satisfying the above conditions, 90% or more of the fundamental wave is diffracted so as to return to a laser diode 101, while the SHG having a wavelength equal to half that of the fundamental wave ray is diffracted in such a manner that only the zero-th-order 21 and first-order 23 thereof are produced and propagate in directions other than that of the input light. Therefore, the entire SHG produced in the SHG element 104 is outputted to the outside the optical resonator without using a filter or the like.

Although the present invention has been fully described by way of example with reference to the accompanying drawings, it is to be noted here that various changes and modifications will become apparent to those skilled in the art. Therefore, such changes and modifications are seen to be within the true spirit and scope of the present invention.

What is claimed is:

1. A second-harmonic generator comprising:
  a laser diode which emits light of a fundamental wave;
  a second-harmonic generating means for generating a second harmonic of the fundamental wave by and for selectively changing a mode of propagation, corresponding to a direction of polarization, of light transmitted therethrough; and
  a diffraction grating unit including a reflective diffraction grating, a transparent medium disposed on said diffraction grating, and a polarization-dependent optical filter integrated with said diffraction grating, said transparent medium being interposed between said diffraction grating and said optical filter,
  said optical filter being located at a side of said diffraction grating whereat light transmitted in the second-harmonic generator incides on the diffraction grating unit, said optical filter transmitting therethrough light having a wavelength of said fundamental wave, said optical filter reflecting said second harmonic in a direction different than that in which the light incides on the diffraction grating unit, and said diffraction grating diffracting light transmitted through said filter in a return direction coincident with the direction in which the light incides on said diffraction grating unit to oscillate said laser diode at a wavelength phase-matched with said second-harmonic generating means.

2. A second-harmonic generator as claimed in claim 1, wherein said second-harmonic generating means comprises an optical waveguide including reverse polarization layers.

3. A second-harmonic generator as claimed in claim 1, wherein said second-harmonic generating means comprises a material selected from the group consisting of $LiNbO_3$, $LiTaO_3$ and $KTiOP_3$.

4. A second-harmonic generator comprising:
  a laser diode which emits light of a fundamental wave;
  an optical waveguide optically coupled to said laser diode so as to receive the light emitted from said laser diode, said optical waveguide having reverse polarization layers which convert a portion of light of the fundamental wave to a second-harmonic thereof; and
  a diffraction grating unit including a reflective diffraction grating, a transparent medium disposed on said diffraction grating and an optical filter integrated with said diffraction grating, said transparent medium being interposed between said diffraction grating and said optical filter,
  said optical filter being located at a side of said diffraction grating whereat light transmitted in the second-harmonic generator incides on the diffraction grating unit, said optical filter transmitting therethrough light having a wavelength of said fundamental wave, said optical filter reflecting said second harmonic in a direction different than that in which light incides on the diffraction grating unit, and said diffraction grating diffracting light transmitted through said filter in a return direction coincident with the direction in which the light incides on said diffraction grating unit to oscillate said laser diode at a wavelength phase-matched with said optical waveguide.

5. A second-harmonic generator comprising:
  a laser diode which emits light of a fundamental wave;
  a second-harmonic generating means for generating a second harmonic of the fundamental wave;
  band filter means for transmitting the second harmonic generated in said second-harmonic generating means and for transmitting light of only a selected wavelength of said fundamental wave; and
  a diffraction grating unit including a reflective diffraction grating, a transparent medium disposed on said diffraction grating, and an optical filter integrated with said diffraction grating, said transparent medium being interposed between said diffraction grating and said optical filter, said optical filter being located at a side of said diffraction grating whereat light transmitted in the second-harmonic generator incides on the diffraction grating unit, said optical filter transmitting therethrough light having a wavelength of said fundamental wave, said optical filter reflecting said second harmonic in a direction different than that in which light incides on the diffraction grating unit, and said diffraction grating diffracting light transmitted through said filter in a return direction coincident with the direction in which the light incides on said diffraction grating unit to oscillate said laser diode at a wavelength phase-matched with said second-harmonic generating means.

6. A second-harmonic generator as claimed in claim 5, wherein said optical filter is a polarization-dependent filter, and said second-harmonic generating means includes a portion for changing a mode of propagation, corresponding to a direction of polarization, of light transmitted therethrough.

7. A second-harmonic generator as claimed in claim 6, wherein said second-harmonic generating means comprises an optical waveguide having reverse polarization layers.

8. A second-harmonic generator as claimed in claim 6, wherein said second-harmonic generating means comprises a material selected from the group consisting of $LiNbO_3$, $LiTaO_3$ and $KTiOP_3$.

9. A second-harmonic generator as claimed in claim 5, wherein said second-harmonic generating means comprises an optical waveguide having reverse polarization layers.

10. A second-harmonic generator as claimed in claim 5, wherein said second-harmonic generating means comprises a material selected from the group consisting of $LiNbO_3$, $LiTaO_3$ and $KTiOP_3$.

* * * * *